United States Patent
Hwang

(10) Patent No.: US 8,053,362 B2
(45) Date of Patent: Nov. 8, 2011

(54) METHOD OF FORMING METAL ELECTRODE OF SYSTEM IN PACKAGE

(75) Inventor: Jong-Taek Hwang, CheongJu-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 739 days.

(21) Appl. No.: 12/140,558

(22) Filed: Jun. 17, 2008

(65) Prior Publication Data
US 2008/0318410 A1 Dec. 25, 2008

(30) Foreign Application Priority Data
Jun. 22, 2007 (KR) .................. 10-2007-0061484

(51) Int. Cl.
*H01L 21/44* (2006.01)
(52) U.S. Cl. ........ 438/667; 438/672; 438/687; 257/698; 257/762; 257/E21.585
(58) Field of Classification Search .......... 438/109, 438/455, 667, 672, 675, 687; 257/74, 686, 257/698, 773, 777, E21.011, E21.585
See application file for complete search history.

(56) References Cited

U.S. PATENT DOCUMENTS

| | | | | |
|---|---|---|---|---|
| 5,091,762 A | * | 2/1992 | Watanabe | 257/71 |
| 5,612,552 A | * | 3/1997 | Owens | 257/202 |
| 6,759,272 B2 | * | 7/2004 | Tsubosaki et al. | 438/109 |
| 6,768,205 B2 | * | 7/2004 | Taniguchi et al. | 257/774 |
| 6,852,627 B2 | | 2/2005 | Sinha et al. | |
| 7,453,150 B1 | * | 11/2008 | McDonald | 257/774 |
| 7,683,489 B2 | * | 3/2010 | Park et al. | 257/762 |
| 7,696,080 B2 | * | 4/2010 | Hwang | 438/612 |
| 7,858,439 B2 | * | 12/2010 | Kim | 438/109 |
| 7,880,292 B2 | * | 2/2011 | Han | 257/698 |
| 2005/0205968 A1 | * | 9/2005 | Kim | 257/621 |
| 2006/0128060 A1 | * | 6/2006 | Kurita | 438/109 |
| 2007/0090511 A1 | * | 4/2007 | Borland et al. | 257/691 |
| 2008/0057674 A1 | * | 3/2008 | Hwang | 438/455 |
| 2008/0061443 A1 | * | 3/2008 | Park | 257/774 |
| 2009/0026524 A1 | * | 1/2009 | Kreupl et al. | 257/316 |
| 2009/0243108 A1 | * | 10/2009 | Gosset et al. | 257/758 |
| 2009/0261416 A1 | * | 10/2009 | Raberg et al. | 257/351 |
| 2009/0261457 A1 | * | 10/2009 | Pratt | 257/621 |
| 2009/0296310 A1 | * | 12/2009 | Chikara | 361/301.4 |
| 2010/0044846 A1 | * | 2/2010 | Ohmi et al. | 257/686 |

FOREIGN PATENT DOCUMENTS

| | | |
|---|---|---|
| DE | 100 44 540 | 1/2002 |
| DE | 10 2005 004 365 | 1/2005 |
| KR | 10-2004-0060843 | 7/2004 |

* cited by examiner

*Primary Examiner* — Mary Wilczewski
*Assistant Examiner* — Toniae Thomas
(74) *Attorney, Agent, or Firm* — Sherr & Vaughn, PLLC

(57) ABSTRACT

A method for forming a metal electrode of a system in package of a system in package including a multilayer semiconductor device having semiconductor devices stacked in a plurality of layers. The method may include forming a through hole extending through the plurality of layers, forming a combustible material layer having high viscosity at a lower portion of the through hole in order to seal the lower portion thereof, and forming a through electrode by filling copper in the through hole. There is an effect of efficiently forming a through electrode having a large depth corresponding to the height of stacked semiconductor devices in the system in package. Filling copper in a through hole having a large depth-to-width ratio may be efficiently done by OSP coating, electrolysis copper plating, and electro Cu plating processes.

19 Claims, 6 Drawing Sheets

METHOD OF FORMING METAL ELECTRODE OF SYSTEM IN PACKAGE

Figure 1A:
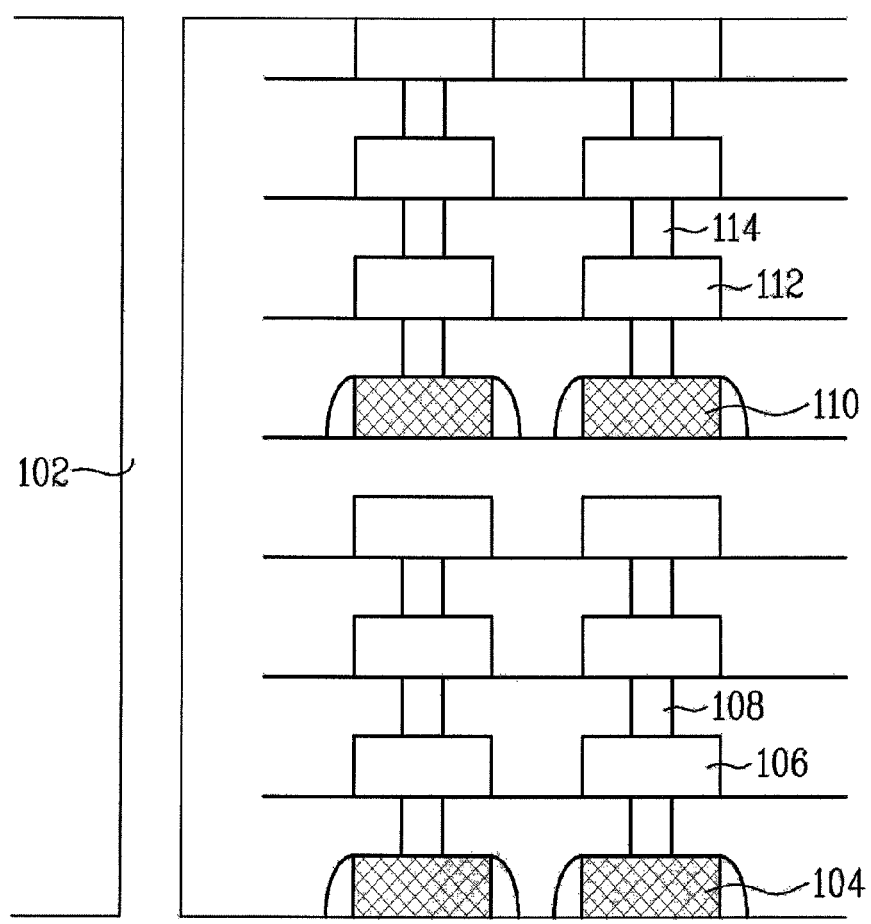

The present application claims priority under 35 U.S.C. §119 to Korean Patent Application No. 10-2007-0061484 (filed on Jun. 22, 2007), which is hereby incorporated by reference in its entirety.

BACKGROUND

Along the trend of multifunction and miniaturization of various electronic devices, a semiconductor device such as an integrated circuit device having a multilayer structure may be provided in an electronic device. Such a multilayer semiconductor device may have a plurality of circuit devices and structured having a small size with an increased integration density of a semiconductor device is increasing. For example, there are proposed a high-integration semiconductor device having a structure of stacking and fixing LSI chips having a through electrode over a plurality of layers and a three-dimensional (3D) semiconductor device having a structure of stacking a plurality of semiconductor substrates having integrated circuits.

As one of key technologies for realizing compact, light and thin electronic equipment, various packaging technologies have been developed in the semiconductor devices to realize high density mounting of semiconductor chips. As a technology related to a package structure of semiconductor devices for reducing an area required for mounting the semiconductor devices on a mother board, there have been developed a pin insertion-type package such as a dual inline package (DIP), a surface mount package such as a small outline package (SOP) by a peripheral lead, and a package having external output terminals in a grid shape on the lower surface of the package such as a ball grid array (BGA). Furthermore, as a technology for realizing high density mounting by reducing an area ratio of a package to semiconductor chips, the pitch of the external output terminals becomes small and the reduction in the size of the package become promoted according to miniaturization of lines of the substrate.

A technology of a multichip package for mounting a plurality of semiconductor chips in a single package has been developed. In the multichip package, a technology of a chip stacked package for stacking a plurality of semiconductor chips has been developed in order to realize higher density mounting. Furthermore, a multichip package systematized by sealing a plurality of semiconductor chips having different functions in a single package is referred to as a system-in-package (SIP) and the development of the SIP has been conducted.

Meanwhile, a separate method from high-density packaging and mounting of semiconductor chips has been given attention as a method for realizing compact, light and thin electronic equipment. The separate method employs a system-on-chip (SOC) such that memory, logic and analog circuits and the like, which are different semiconductor chips, are mixedly loaded to integrate system functions in a single chip.

However, in a case of integrating memory, logic circuits and the like in a single chip, it is difficult to obtain a low-voltage memory circuit, and thus, necessary to control noise generated in the logic circuit. Further, in a case of mixedly loading a bipolar analog circuit, it is difficult to manufacture the analog circuit in a CMOS circuit equal to memory and logic circuits. Accordingly, instead of the SOC, an SIP capable of being developed for a short period of time at low cost to have the same functions as the system on chip has been given attention.

As a technology required to manufacture 3D multilayer LSI and SIP, there is a technology for forming a through electrode in a semiconductor substrate. A current process for forming a through electrode in a silicon (Si) wafer still has many process steps. Moreover, there is difficulty in forming a through electrode having a large depth. A through electrode capable of connecting devices should be formed to package various devices into one body. In order to form the through electrode, metal is filled in the through hole formed by etching in the previous step to form a conductor through which electricity flows. The SIP includes a multilayer semiconductor device having semiconductor devices stacked in a plurality of layers. As a total thickness of the multilayer semiconductor device having a plurality of layers, the through hole has a very large depth compared to an opening area. Accordingly, there is a problem that it is difficult to closely form a through electrode by filling tungsten in a through hole by a general chemical vapor deposition (CVD) process.

SUMMARY

Embodiments relate to a method for forming a metal electrode of an SIP, and more particularly, to a method for forming a metal electrode of an SIP including a multilayer semiconductor device having semiconductor devices stacked in a plurality of layers, such that the metal electrode serves as a common electrode of the semiconductor devices disposed at the respective layers to pass through the respective layers.

Embodiments relate to a method for forming a metal electrode of an SIP that stably forms the through electrode, the SIP including a multilayer semiconductor device having a long through electrode to pass through a plurality of layers.

Embodiments relate to a method for forming a metal electrode of an SIP including a multilayer semiconductor device having semiconductor devices stacked in a plurality of layers and may include at least one of the following steps: forming a through hole to pass through the plurality of layers; and then coating and sealing a combustible material having a high viscosity at a lower portion of the through hole; and then forming a through electrode by filling copper in the through hole.

Embodiments relate to a method that may include at least one of the following steps: providing a system-in-package including a multilayer semiconductor device having semiconductor devices stacked in a plurality of layers; and then forming a through hole extending through the plurality of layers; and then forming a combustible material having a high viscosity at a lowermost portion of the through hole; and then forming a through electrode by filling copper in the through hole.

Embodiments relate to a method that may include at least one of the following steps: providing a system-in-package including a multilayer semiconductor device having semiconductor devices stacked in a plurality of layers; and then forming a through hole extending through the plurality of layers; and then sealing a lowermost end of the through hole; and then forming a through electrode composed of copper in the through hole.

Embodiments relate to a method that may include at least one of the following steps: providing a system-in-package including a multilayer semiconductor device having semiconductor devices stacked in a plurality of layers; and then forming a through hole extending through the plurality of layers; and then forming a layer composed of an organic material on the lowermost surface of the multilayer semiconductor device and on a lowermost end of the through hole to seal the lowermost end of the through hole; and then forming a copper seed layer on the lowermost surface of the layer composed of an organic material, on inner walls of the through hole and on the uppermost surface of the multilayer semiconductor device; and then forming a copper layer on the copper seed layer; and then removing a portion of the copper layer formed on the uppermost portion of the multilayer semiconductor device; and then removing the layer composed of an organic material and the copper layer formed on the lowermost portion of the combustible material layer to thereby form a through electrode.

DRAWINGS

Example FIGS. 1A to 1F illustrate a method for forming a through electrode of a system-in-package including a multilayer semiconductor device, in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

The configuration and the effect of embodiments are described with reference to the accompanying drawings. The configuration and the effect of embodiments illustrated in the drawings and described herein are explained as at least one example, and the technical idea, essential configuration and effect of embodiments are not limited thereto.

Example FIGS. 1A to 1F illustrate the sequential steps of a method for forming a through electrode of an SIP including a multilayer semiconductor device in accordance with embodiments. Such a method may include forming a through electrode of a multilayer semiconductor device having a two-story structure. However, embodiments may be applied to a method for forming a through electrode of a multilayer semiconductor device having three or more layers without being limited thereto.

As illustrated in example FIG. 1A, through hole 102 may be formed in and extending through a multilayer semiconductor device. Through hole 102 may then be filled with a conductive material to form a through electrode. In an SIP having a plurality of semiconductor device layers, a through electrode may be formed extending through a plurality of layers such that power lines of the semiconductor devices of respective layers or lines of various input and output signals are commonly connected to each other.

Figure 1B:
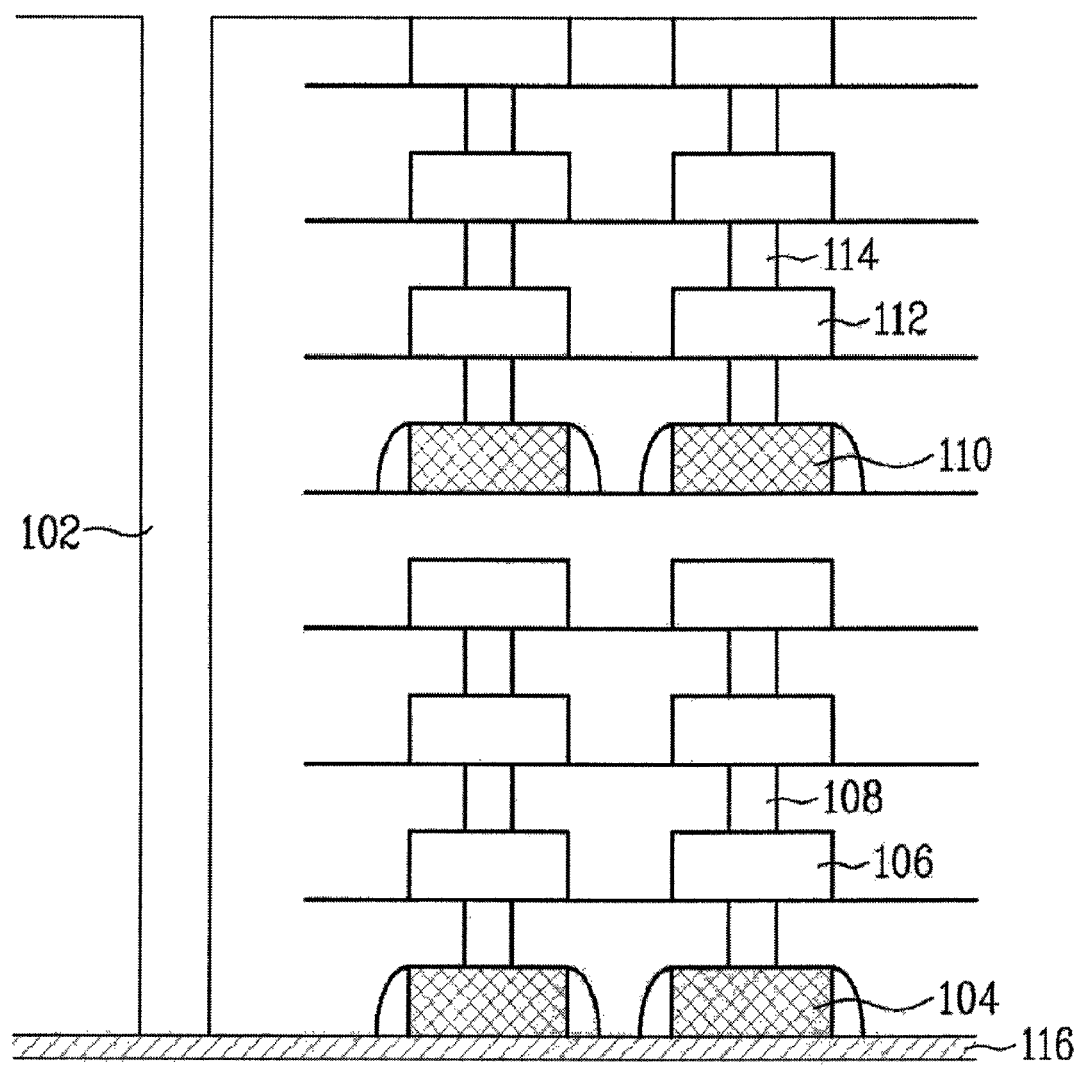
Figure 1C:
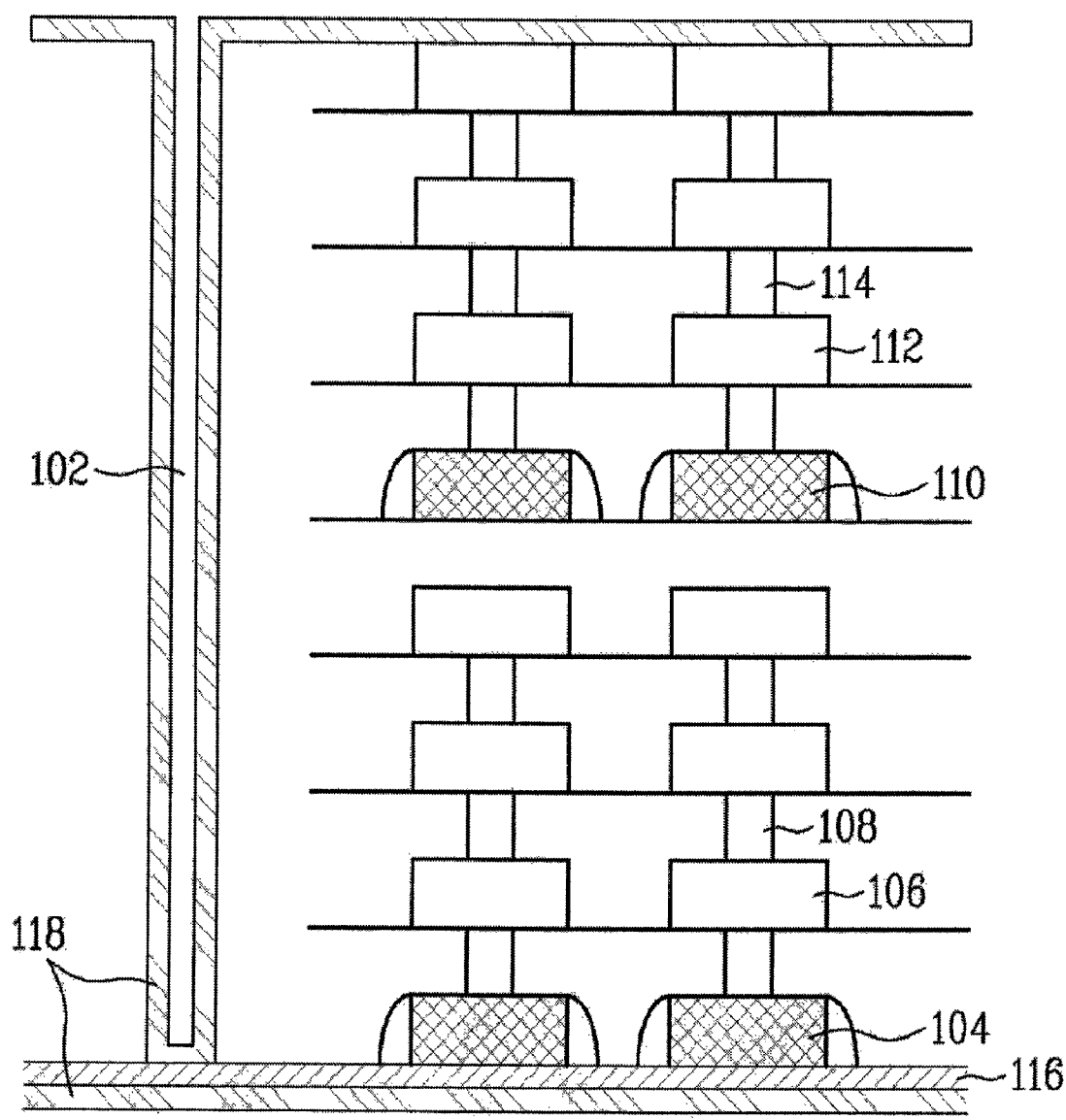
Figure 1D:
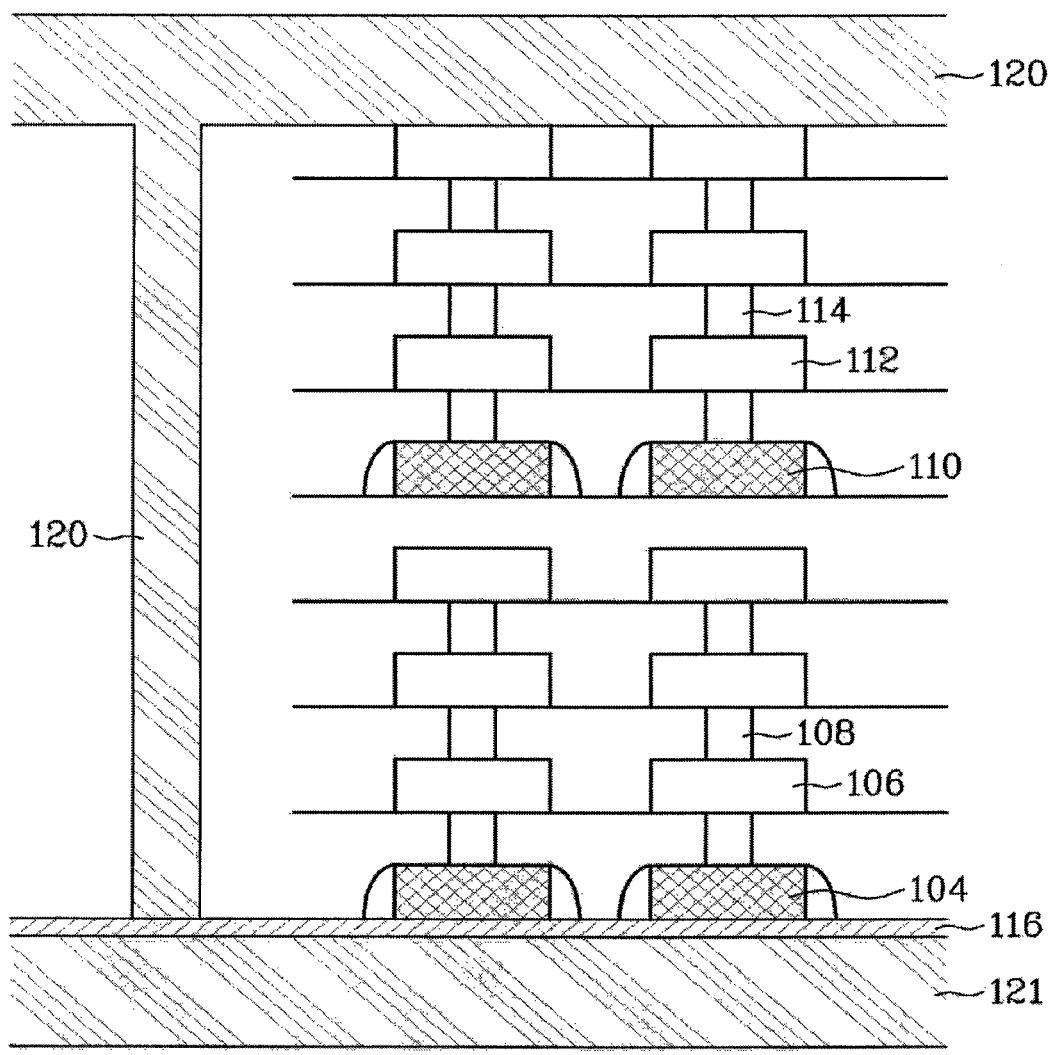
Figure 1E:
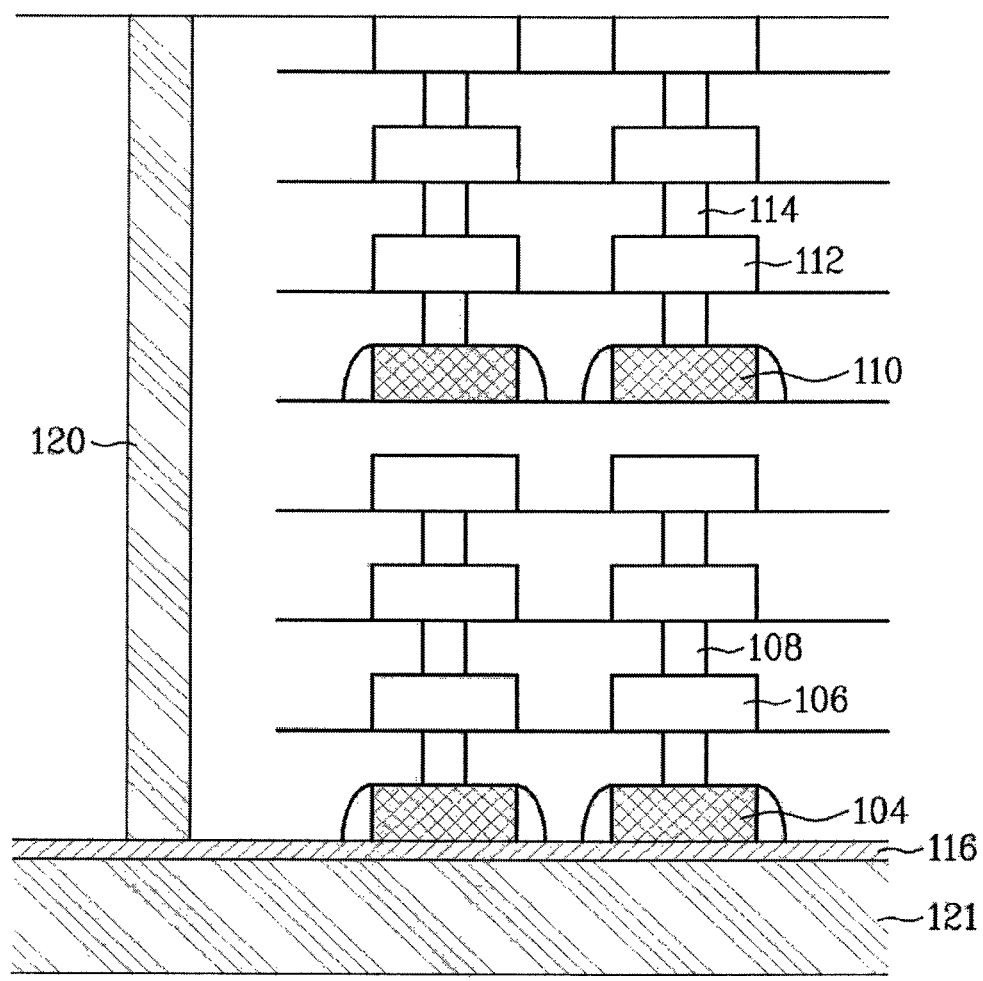
Figure 1F:
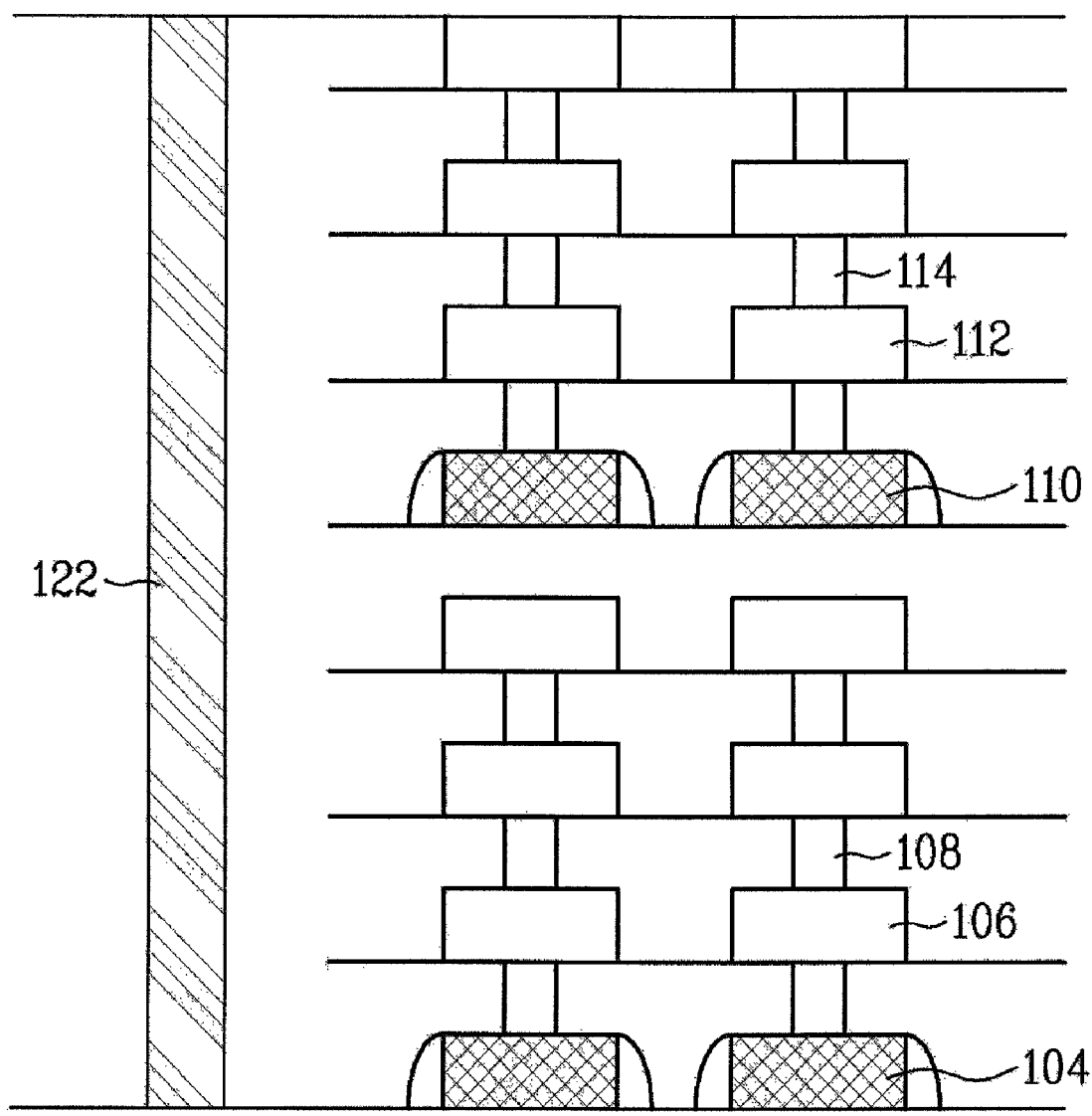

As illustrated in example FIG. 1F, the multilayer semiconductor device in accordance with embodiments may include first transistor portion 104 having transistor devices of a first layer which is a lowermost layer in a multilayer structure, first metal portion 106 having metal lines in the first layer, first via portion 108 which connects the metal lines of the first layer with an upper metal layer, second transistor portion 110 having transistor devices of a second layer, second metal portion 112 having metal lines in the second layer, second via portion 114 which connects the metal lines of the second layer with an upper metal layer, and a through electrode 122 which is a common line for power of the first and second layers or various input and output signals.

As illustrated in example FIG. 1A, in order to form through electrode 122, which may be a common line of the semiconductor devices of the first and second layers, through hole 102 may be formed extending through the first and second layers. In accordance with embodiments, through hole 102 may be formed by reactive ion etching (RIE).

As illustrated in example FIG. 1B, a lowermost end of through hole 102 may then be sealed by coating a combustible material 116 having high viscosity. In accordance with embodiments, the combustible material 116 having high viscosity may be an organic solder preservative (OSP). An OSP may serve to prevent the surface of copper (Cu) from being in contact with air by coating organic matter on the surface of a pad of a printed circuit board, thereby preventing oxidation of copper. The organic matter coated on the surface of the pad is a material similar to flux, which is a surface treatment material having high viscosity used in a method referred to as preflux treatment.

As further illustrated in example FIG. 1B, combustible material layer 116 composed of organic solder preservative may be coated at the lowermost end of through hole 102 to form a seal. The reasons for sealing the lower end of hole 102 by forming the organic solder preservative are as follows. First, when subsequently forming a Cu seed layer, since opposite openings of hole 102 are open and through hole 102 has an excessively large depth, copper cannot be deposited in through hole 102. Accordingly, a copper seed layer cannot be formed using physical vapor deposition (PVD). Thus, the lowermost end of through hole 102 may be sealed by forming combustible material 116 composed of the organic solder preservative to enable formation of a seed layer through electrolysis Cu plating. Secondly, Cu layer 121 subsequently formed at the lowermost end of through hole 102 and serving as the lowermost end of the multilayer semiconductor device after electro Cu plating (ECP) can be easily removed. Specifically, since Cu layer 122 may be formed by plating using ECP without using tungsten CVD, Cu layer 121 may be also plated at the lowermost end of through hole 102. However, if the organic solder preservative of combustible material layer 116 is formed between the lowermost end of through hole 102 and Cu layer 121, Cu layer 121 may be easily separated while combustible material layer 116 is melted in a subsequent heat treatment. Third, since combustible material layer 116 composed of an organic solder preservative has high viscosity, combustible material layer 116 may not flow into through hole 102 during formation thereof, and Cu seed layer 118 may be closely formed on and/or over an inner wall of through hole 102.

As illustrated in example FIG. 1C, Cu seed layer 118 may then be formed by electrolysis Cu plating (ECP). Cu seed layer 118 may be formed through ECP, and copper starts to be plated on and/or over all portions in contact with an electrolyte. The electrolysis plating is a chemical plating method in which metal ions are reduced by the action of a chemical reducing agent without using electric current from the outside. In accordance with electrolysis plating, it is possible to obtain a uniform and dense plating layer regardless of a shape of a material. Electrolysis plating also enables plating of a nonmetallic material and plating of an alloy containing a reducing agent. The electrolysis Cu plating means electrolysis plating using copper (Cu).

As further illustrated in example FIG. 1C, copper may be plated on sidewalls of through hole 102 and at a lowermost portion of combustible material layer 116 to form Cu seed layer 118. Cu seed layer 118 may have a thickness in a range between 50 Å to 1500 Å. In accordance with embodiments, Cu seed layer 118 may have a thickness of 800 Å. Since the Cu layer is formed at a low velocity in electrolysis Cu plating, only Cu seed layer 118 may be formed and copper filled in through hole 102 by performing ECP later. The reasons for forming Cu seed layer 118 by ECP are as follows. First, in accordance with embodiments, an ECP method is used instead of a general tungsten CVD in order to fill copper in through hole 102 having a large depth compared to an opening area of through hole 102. Since ECP is an electro plating method, it is necessary to form a seed layer in advance. Secondly, in a method for depositing a seed layer using a general PVD, it is difficult to closely form a seed layer in through hole 102 having openings on opposite sides thereof and having a large depth compared to an opening area. Accordingly, an ECP method is used.

As illustrated in example FIG. 1D, copper may then be filled in through hole 102 by performing an electro Cu plating process to form first copper layer 120 in through hole 102 and on and/or over the semiconductor device and second copper layer 121 on combustible material layer 116. In accordance with embodiments, copper may be filled in through hole 102 by an electro Cu plating method capable of bottom-up filling instead of a general tungsten CVD method. The electro Cu plating process means an electro plating process using copper (Cu). Bottom-up filling is a technology for increasing a velocity at which a film is formed from the bottom of through hole 102 by injecting an additive into a plating solution and periodically and inversely applying an electric field. A velocity of copper growing from the bottom of through hole 102 may be higher than a growing velocity from a sidewall of through hole 102. Accordingly, it may be possible to efficiently fill cooper in through hole 102 having a large depth compared to an opening area. Copper layers 120 and 121 created by the electro Cu plating process may be formed on and/or over the entire surface of the multilayer semiconductor device. Accordingly, copper layers 120 and 121 may be formed inside through hole 102, at an uppermost end of through hole 102 corresponding to an uppermost portion of the multilayer semiconductor device, and at a lower end of combustible material layer 116 corresponding to a lowermost portion of the multilayer semiconductor device.

As illustrated in example FIG. 1E, a portion of copper layer 120 formed at the uppermost portion of the multilayer semiconductor device, e.g., covering the uppermost portion of through hole 102 corresponding to the uppermost end of the multilayer semiconductor device, may then be planarized by a chemical mechanical polishing (CMP) method.

As illustrated in example FIG. 1F, the combustible material layer 116 and copper layer 121 formed at the lowermost end of combustible material layer may then be removed by heat treatment. The heat treatment may be conducted, for example, at a temperature range of between 100° C. to 300° C. The heat treatment may be conducted at a temperature of 150° C. The heat treatment may be conducted for a time range of between 30 minutes to 100 minutes. The heat treatment may be conducted for a time of 60 minutes. Accordingly, the organic solder preservative of combustible material layer 116, which is a combustible material having high viscosity, is melted and removed by applying heat. At the same time, copper layer 121 formed at the lowermost end of combustible material layer 116 may be easily separated and removed, thereby completing through electrode 122.

As described above, the method for forming a metal electrode in a system in package in accordance with embodiments has an effect of efficiently forming a through electrode having a large depth corresponding to the height or thickness of stacked semiconductor devices. The through electrode in accordance with embodiments may serve as a common electrode of the respective semiconductor devices. The through hole in accordance with embodiments may extend through a plurality of layers in a system-in-package for stacking and packaging several semiconductor devices. Further, there is an effect of closely filling copper in the through hole having a large depth compared to an opening area by OSP coating, electrolysis Cu plating, and electro Cu plating processes.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
providing a system-in-package including a multilayer semiconductor device having semiconductor devices stacked in a plurality of layers; and then
forming a through hole extending through the plurality of layers; and then
forming a combustible material having a high viscosity at a lowermost portion of the through hole; and then
forming a through electrode by filling copper in the through hole.

2. The method of claim 1, wherein forming the through electrode comprises:
forming a copper seed layer on an entire surface of the multilayer semiconductor device and on inner walls of the through hole; and then
forming a copper layer in the through hole and on an entire surface of the multilayer semiconductor device and on inner walls of the through hole; and then
removing a portion of the copper layer formed on an uppermost portion of the multilayer semiconductor device; and then
removing the combustible material layer and a portion of the copper layer formed on a lowermost portion of the combustible material layer.

3. The method of claim 2, wherein removing the portion of the copper layer formed on an uppermost portion of the multilayer semiconductor device is performed using a planarization process.

4. The method of claim 2, wherein removing the portion of the copper layer formed on the uppermost portion of the multilayer semiconductor device is performed by a chemical mechanical polishing.

5. The method of claim 2, wherein the copper seed layer is formed having a thickness in a range between 50 Å to 1500 Å.

6. The method of claim 2, wherein the copper seed layer is formed using an electrolysis plating method.

7. The method of claim 2, wherein the copper layer is formed in the through hole using electro plating.

8. The method of claim 2, wherein removing the combustible material layer and the portion of the copper layer formed on the lowermost portion of the combustible material layer is performed by heat treatment.

9. The method of claim 8, wherein the heat treatment is conducted at a temperature range of between 100° C. to 300° C. and for a time period between 30 to 100 minutes.

10. The method of claim 1, wherein the combustible material layer comprises an organic solder preservative.

11. The method of claim 1, wherein the through hole is formed by reactive ion etching.

12. The method according to claim 1, wherein the through hole has a large depth-to-width ratio.

13. A method comprising:
providing a system-in-package including a multilayer semiconductor device having semiconductor devices stacked in a plurality of layers; and then
forming a through hole extending through the plurality of layers; and then
sealing a lowermost end of the through hole; and then
forming a through electrode composed of copper in the through hole,
wherein sealing the lowermost end of the through hole comprises forming a layer composed of a combustible material on the lowermost end of the through hole.

14. The method of claim 13, wherein the combustible material has high viscosity.

15. The method of claim 14, wherein the combustible material comprises an organic material.

16. The method of claim 13, wherein forming the through electrode comprises:
forming a copper seed layer on lowermost and uppermost surfaces of the multilayer semiconductor device and on inner walls of the through hole; and then
forming a copper layer on the copper seed layer; and then
removing a portion of the copper layer formed on the uppermost surface of the multilayer semiconductor device; and then
removing the combustible material layer and a portion of the copper layer formed on the lowermost surface of the combustible material layer.

17. A method comprising:
providing a system-in-package including a multilayer semiconductor device having semiconductor devices stacked in a plurality of layers; and then
forming a through hole extending through the plurality of layers; and then forming a layer composed of an organic material on the lowermost surface of the multilayer semiconductor device and on a lowermost end of the through hole to seal the lowermost end of the through hole; and then
forming a copper seed layer on the lowermost surface of the layer composed of an organic material, on inner walls of the through hole and on the uppermost surface of the multilayer semiconductor device; and then
forming a copper layer on the copper seed layer; and then
removing a portion of the copper layer formed on the uppermost portion of the multilayer semiconductor device; and then
removing the layer composed of an organic material and the copper layer formed on the lowermost portion of the combustible material layer to thereby form a through electrode.

18. The method of claim 17, wherein the layer composed of an organic material is combustible and has high viscosity.

19. The method of claim 17, wherein the layer composed of an organic material comprises an organic solder preservative material.

* * * * *